(12) United States Patent
Choi

(10) Patent No.: US 10,768,149 B2
(45) Date of Patent: Sep. 8, 2020

(54) METHOD AND APPARATUS FOR IMPROVING THE TRANSMITTING AND RECEIVING DIRECTIVITY IN LONG-RANGE ULTRASONIC TESTING

(71) Applicants: RESEARCH COOPERATION FOUNDATION OF YEUNGNAM UNIVERSITY, Gyeongsangbuk-do (KR); DIGITAL ULTRASONICS CO. LTD, Gyeongsangbuk-do (KR)

(72) Inventor: Myoung-Seon Choi, Daegu (KR)

(73) Assignees: RESEARCH COOPERATION FOUNDATION OF YEUNGNAM UNIVERSITY, Gyeongsangbuk-Do (KR); DIGITAL ULTRASONICS CO. LTD, Gyeongsangbuk-Do (KR)

( * ) Notice: Subject to any disclaimer, the term of this patent is extended or adjusted under 35 U.S.C. 154(b) by 250 days.

(21) Appl. No.: 15/773,766

(22) PCT Filed: Nov. 4, 2016

(86) PCT No.: PCT/KR2016/012628
§ 371 (c)(1),
(2) Date: May 4, 2018

(87) PCT Pub. No.: WO2017/078447
PCT Pub. Date: May 11, 2017

(65) Prior Publication Data
US 2018/0321195 A1 Nov. 8, 2018

(30) Foreign Application Priority Data
Nov. 5, 2015 (KR) .................. 10-2015-0155170

(51) Int. Cl.
*G01N 29/04* (2006.01)
*G01N 29/40* (2006.01)
*G01N 29/26* (2006.01)

(52) U.S. Cl.
CPC ........... *G01N 29/40* (2013.01); *G01N 29/043* (2013.01); *G01N 29/262* (2013.01);
(Continued)

(58) Field of Classification Search
CPC .. G01N 29/2412; G01N 29/40; G01N 29/262; G01N 29/043; G01N 2291/044;
(Continued)

(56) References Cited

U.S. PATENT DOCUMENTS

| 2,497,901 A | * | 2/1950 | Mott | B06B 1/08 |
| | | | | 310/26 |
| 3,308,476 A | * | 3/1967 | Kleesattel | G01L 1/10 |
| | | | | 73/573 |
| 2012/0091829 A1 | * | 4/2012 | Choi | G01N 29/2418 |
| | | | | 310/26 |

FOREIGN PATENT DOCUMENTS

| JP | 2006-280639 A | 10/2006 |
| KR | 10-2004-0038825 A | 5/2004 |

(Continued)

OTHER PUBLICATIONS

International Search Report for PCT/KR2016/012628.

*Primary Examiner* — Suman K Nath
(74) *Attorney, Agent, or Firm* — The PL Law Group, PLLC

(57) ABSTRACT

An apparatus for improving transmission directivity according to an embodiment of the present invention includes a phased array probe including a channel 1 transducer and a channel 2 transducer which are arranged at intervals corresponding to a quarter wavelength at a center frequency of a guided wave pulse for long-range ultrasonic testing, and a (Continued)

drive unit which supplies electric pulses with opposite phases to the channel 1 transducer and the channel 2 transducer of the channel 1 transducer and the channel 2 transducer, which is disposed on the front end on the basis of an intended transmission direction, is driven with delay by a time corresponding to a quarter frequency of the center frequency than the other transducer disposed on the rear end.

15 Claims, 9 Drawing Sheets

(52) U.S. Cl.
CPC . *G01N 2291/044* (2013.01); *G01N 2291/106* (2013.01); *G01N 2291/2634* (2013.01)

(58) Field of Classification Search
CPC ..... G01N 2291/2634; G01N 2291/106; G01N 2291/0422; G01N 2291/0425; H01L 41/12; H01L 41/06; B06B 1/08
See application file for complete search history.

(56) References Cited

FOREIGN PATENT DOCUMENTS

| KR | 10-2011-0003140 A | 1/2011 |
|---|---|---|
| KR | 10-2011-0046061 A | 5/2011 |
| KR | 10-1201501 B1 | 11/2012 |

* cited by examiner

500

510  530

METHOD AND APPARATUS FOR IMPROVING THE TRANSMITTING AND RECEIVING DIRECTIVITY IN LONG-RANGE ULTRASONIC TESTING

CROSS REFERENCE TO RELATED APPLICATIONS AND CLAIM OF PRIORITY

This application claims benefit under 35 U.S.C. 119(e), 120, 121, or 365(c), and is a National Stage entry from International Application No. PCT/KR2016/012628, filed Nov. 4, 2016 which claims priority to the benefit of Korean Patent Application No. 10-2015-0155170 filed in the Korean Intellectual Property Office on Nov. 5, 2015, the entire contents of which are incorporated herein by reference.

TECHNICAL FIELD

Embodiments of the present invention relate to nondestructive testing technology using ultrasonic waves.

BACKGROUND ART

Long-range ultrasonic testing (LRUT) is one of nondestructive testing methods for cost-effective detection of defects, such as corrosions, cracks, and the like, using low frequency (typically 100 kHz or less) guided waves propagating far along the length of the structure, such as a pipeline, a pipe, a rope, a plate, a shell, or the like.

Guided waves, such as guide waves of fundamental torsional mode (T(0,1) mode) and fundamental shear horizontal mode ($SH_0$ mode), have proven to be particularly useful for LRUT of cylindrical structures and plate structures. This is because such guided waves have a desirable characteristic that their propagation speed is constant irrespective of frequency and they have a relatively uniform particle displacement in a section of the structure perpendicular to the propagation direction and are insensitive to fluid which may be in/out of the structure.

One of the most important characteristics required for an effective LRUT system would be the ability to transmit a single-mode guided wave pulse in an intended direction and identify and detect the same-mode echoes which have propagated in an intended direction.

A phased array probe, which is widely used to obtain such transmission and reception directivity, is composed of the same transducers of two channels acoustically coupled to a surface of the structure and operated in a pulse-echo mode, and the spacing between the two channels corresponds to a quarter wavelength at the center frequency of the guided wave pulse.

A prior art for operating such a phased array probe induces constructive interference between guided waves of two channels propagating in the intended direction (forward direction) and destructive interface between guided waves propagating in a direction (backward direction) opposite to the intended direction, thereby allowing an LRUT system to have transmission directivity. In addition, in the receiving process, a channel that first detects forward echoes is selected, phases of signals of the selected channel are delayed by 90 degrees, and then the phase-delayed channel signals and the other channel signals are summed up, thereby enhancing forward echo signals and suppressing backward echo signals.

Meanwhile, a magnetostrictive transducer used in the LRUT system is composed of an object having excellent magnetostrictive properties, a permanent magnet (or electromagnet) as a means of applying a bias static magnetic field to the magnetostrictive object, and a radiofrequency (RF) coil which applies a dynamic magnetic field to a region of within the bias magnetic field or detects a change in magnetic field caused by a guided wave entering the region of the bias magnetic field.

In the case of a structure made of a ferromagnetic material, such as iron, a noncontact transducer may be realized by using the structure itself as an element of the transducer. In the case of a structure made of a nonmagnetic material, thin (usually 0.2 mm or less) strips (or patches) of nickel or iron-cobalt alloys adhered to a surface of the structure may be used. Such a magnetostrictive patch transducer has been widely used for LRUT of steel structures. This is because these magnetostrictive materials have superior magnetostrictive properties as compared with iron and allow easy formation of magnetic fields. Also, according to the relative directions of the static magnetic field and the dynamic magnetic field, the magnetostrictive patch transducer was able to selectively transmit and receive various guided wave modes. Due to the Wiedemann effect, the above transducer, driven by two mutually perpendicular magnetic fields, was particularly suitable for transmitting and receiving the $SH_0$ and T (0,1) modes.

A phased array magnetostrictive probe composed of the same two magnetostrictive strip transducers have been widely used in LRUT of pipelines. The individual transducer is composed of an iron-cobalt alloy strip which is bonded to an outer surface of the pipeline so as to surround the circumference thereof, and a solenoid-type RF coil which surrounds the bonded strip and forms a dynamic magnetic field on the strip in the width direction of the strip (a pipeline longitudinal direction). Residual magnetization in the strip is used as the bias magnetic field directed to the strip longitudinal direction (a pipe line circumferential direction) required for operation of a guided wave of T (0,1) mode. This residual magnetization is formed by moving a U-shaped permanent magnet along the two bonded strips at a uniform speed once or twice.

Recently, a phased array magnetostrictive probe has also been used which consist of a magnetostrictive band that include one or more solenoids closely surrounding a magnetostrictive strip or patch, and elongated spiral surface RF coils of two channels. A bias magnetic field may be optimized by flowing a direct current through the solenoids and the spacing between two legs of the spiral coil which corresponds to a half wavelength at the center frequency of the guided wave pulse results in an improved signal-to-noise ratio.

Main operating parameters, such as the spacing for transducers, a driving time difference for electric pulses for driving the transducers, and a phase delay for echo signals are all determined by taking into consideration the center frequency characteristic of the intended guided wave pulse. This means that the frequency characteristics of the transducer are very important in improving the transmission and reception directivity for efficient long-range ultrasonic testing. The reflectivity of a guided wave of T (0, 1) mode due to the thickness variation in a pipe specimen having a stepwise thickness variation depends on the incident direction and frequency thereof. That is, the reflectivity for the wave incident from a thick region increases with increasing frequency while the reflectivity for the wave incident from a thin region rather decreases with increasing frequency. The former is a universal property of wave reflection that can be predicted, and the latter is due to the geometric acoustical properties of the guided wave. Similar reflection characteristics will appear at both ends of the magnetostrictive patch bonded to the structure surface, which will have a considerable impact on the frequency characteristics of the phased array magnetostrictive probe. This effect may increase with the increasing wave frequency or the thickness ratio of the magnetostrictive patch to the structure.

SUMMARY

An objective of embodiments of the present invention is to provide an apparatus and method for improving transmission and reception directivity in long-range ultrasonic testing.

According to one embodiment of the present invention, there is provided an apparatus for improving transmission directivity, the apparatus including: a phased array probe comprising two channel transducers arranged on a subject to be tested at an interval corresponding to a quarter wavelength at a center frequency of a guided wave pulse for long-range ultrasonic testing; and a drive unit configured to drive one transducer of the two channel transducers, which is disposed rearward with respect to an intended direction of the guided wave pulse, to transmit a forward guided wave pulse and a backward guided wave pulse into the object to be tested by supplying a first electric pulse to the channel transducer disposed rearward and then to drive the other transducer of the two channel transducers, which is disposed forward with respect to the intended direction, to transmit a forward guided wave pulse and a backward guided wave pulse into the object to be tested by supplying a second electric pulse of a phase opposite to that of the first electric pulse to the channel transducer disposed forward after an elapse of a time interval corresponding to a quarter wavelength at the center frequency from a time of supplying the first electric pulse, thereby causing the two backward guided wave pulses transmitted by the channel transducer disposed forward and the channel transducer disposed rearward to overlap with each other without a time difference and form destructive interference.

According to another embodiment of the present invention, there is provided an apparatus for improving reception directivity, the apparatus including: a phased array probe comprising two channel transducers arranged on an object to be tested at an interval corresponding to a quarter wavelength of a center frequency of a guided wave pulse for long-range ultrasonic testing; and a signal processing unit configured to delay a phase of one of guided wave echo signals detected by the two channel transducers, adjust amplitudes of the phase-delayed guided wave echo signal and the non-phase delayed guided wave echo signal using a phase difference between the phase-delayed guided wave echo signal and the non-phase delayed guided wave echo signal, and then sum up the two amplitude-adjusted guided wave echo signals.

The signal processing unit may generate the phase-delayed signal using a phase delay function of $$\phi = \frac{90° \cdot f_c}{f}$$

(here, $f_c$ denotes the center frequency and $f$ denotes a wave frequency of a detected guided wave echo signal).

The signal processing unit may adjust the amplitudes of the phase-delayed guided wave signal and the non-phase delayed guided wave echo signal using an amplitude adjustment function of $g_\theta = (1-|\sin(\Delta\theta/2)|)^m$ (here, $\Delta\theta$ denotes the phase difference and m is an integer greater than or equal to 0).

The phased array probe may further include a magnetostrictive band having a width corresponding to a $(2k+1)/4$ (here, k is an integer greater than or equal to 1) wavelength at the center frequency, the two channel transducers may be radiofrequency (RF) coils arranged on the magnetostrictive band at an interval corresponding to the quarter wavelength, and a distance between each end of the magnetostrictive band in the width direction and a center of coil legs adjacent to the end may be the same as the quarter wavelength.

The signal processing unit may further adjust the amplitudes of the two amplitude-adjusted guided wave echo signals based on an intended reception direction of a guided wave echo and an amplitude difference between the two amplitude-adjusted guided wave echo signals.

The signal processing unit may further adjust the amplitudes of the two amplitude-adjusted guided wave echo signals using an amplitude adjustment function of $$g_A = \begin{cases} 1, \text{ for } A_F < A_L \\ \left(\frac{A_L}{A_F}\right)^n, \text{ for } A_F \geq A_L \end{cases}$$

(here, $A_F$ denotes an amplitude of an amplitude-adjusted guided wave echo signal of a channel that first detects a guided wave echo propagating in the intended reception direction, $A_L$ denotes an amplitude of an amplitude-adjusted guided wave echo signal of the other channel, and n is an integer greater than or equal to 0).

According to still another embodiment of the present invention, there is provided a method of improving transmission directivity by using a phased array probe comprising two channel transducers arranged on an object to be tested at an interval corresponding to a quarter wavelength of a center frequency of a guided wave pulse for long-range ultrasonic testing, the method including: driving one transducer of the two channel transducers, which is disposed rearward with respect to an intended direction of the guided wave pulse, to transmit a forward guided wave pulse and a backward guided wave pulse into the object to be tested by supplying a first electric pulse to the channel transducer disposed rearward; and driving the other transducer of the two channel transducer, which is disposed forward with respect to the intended direction, to transmit a forward guided wave pulse and a backward guided wave pulse into the object to be tested by supplying a second electric pulse of a phase opposite to that of the first electric pulse to the channel transducer disposed forward after an elapse of a time interval corresponding to a quarter wavelength at the center frequency from a time of supplying the first electric pulse, thereby causing the two backward guided wave pulses transmitted by the channel transducer disposed forward and the channel transducer disposed rearward to overlap with each other without a time difference and form destructive interference.

In yet another embodiment of the present invention, there is provided a method of improving reception directivity by using a phased array probe comprising two channel transducers arranged on an object to be tested at an interval corresponding to a quarter wavelength of a center frequency of a guided wave pulse for long-range ultrasonic testing, the method including: delaying a phase of one of guided wave echo signals detected by the two channel transducers; adjusting amplitudes of the phase-delayed guided wave echo signal and the non-phase delayed guided wave echo signal using a phase difference between the phase-delayed guided wave echo signal and the non-phase delayed guided wave echo signal; and summing the two amplitude-adjusted guided wave echo signals.

The delaying of the phase may include delaying the phase using a phase delay function of $$\phi = \frac{90° \cdot f_c}{f}$$

(here, $f_c$ denotes the center frequency and $f$ denotes a wave frequency of a detected guided wave echo signal).

The adjusting of the amplitudes may include adjusting the amplitudes of the phase-delayed guided wave signal and the non-phase delayed guided wave echo signal using an amplitude adjustment function of $g_\theta = (1-|\sin(\Delta\theta/2)|)^m$ (here, $\Delta\theta$ denotes the phase difference and m is an integer greater than or equal to 0).

The phased array probe may further include a magnetostrictive band having a width corresponding to a (2k+1)/4 (here, k is an integer greater than or equal to 1) wavelength at the center frequency, the two channel transducers may be radiofrequency (RF) coils arranged on the magnetostrictive band at an interval corresponding to the quarter wavelength, and a distance between each end of the magnetostrictive band in the width direction and a center of coil legs adjacent to the end may be the same as the quarter wavelength.

The summing may include further adjusting the amplitudes of the two amplitude-adjusted guided wave echo signals based on an intended reception direction of a guided wave echo and an amplitude difference between the two amplitude-adjusted guided wave echo signals and summing the two guided wave echo signals whose amplitudes are further adjusted.

The further adjusting of the amplitudes may include further adjusting the amplitudes of the two amplitude-adjusted guided wave echo signals using an amplitude adjustment function of $$g_A = \begin{cases} 1, & \text{for } A_F < A_L \\ \left(\frac{A_L}{A_F}\right)^n, & \text{for } A_F \geq A_L \end{cases}$$

(here, $A_F$ denotes an amplitude of an amplitude-adjusted guided wave echo signal of a channel that first detects a guided wave echo propagating in the intended reception direction, $A_L$ denotes an amplitude of an amplitude-adjusted guided wave echo signal of the other channel, and n is an integer greater than or equal to 0).

According to another embodiment of the present invention, there is provided a phased array magnetostrictive probe including: a magnetostrictive band having a width corresponding to a (2k+1)/4 (here, k is an integer greater than or equal to 1) wavelength at a center frequency of a guided wave pulse for long-range ultrasonic testing; and a channel 1 RF coil and a channel 2 RF coil arranged on the magnetostrictive band at an interval corresponding to a quarter wavelength at the center frequency, wherein a distance between each end of the magnetostrictive band in the width direction and a center of coil leg adjacent to the end corresponds to the quarter wavelength.

According to embodiments of the present invention, transmission directivity in long-range ultrasonic testing may be improved by effectively suppressing a guided wave propagating in a direction opposite to an intended transmission direction.

In addition, in a reception direction control technology based on phase delay, amplitudes of phase-delayed channel signals and the other channel signals are adjusted using a phase difference between these signals, which varies over time, before adding the signals, and thereby it is possible to efficiently improve the reception directivity.

Moreover, in the case of a phased array probe including a magnetostrictive band, a frequency response of the phased array probe may be optimized by inducing coherency between a pulse reflected and returned from one end of the magnetostrictive band and an enhanced guided wave, and the reception directivity may be further improved by taking advantage of the fact that the sign of the amplitude difference of two channel signals varies with the incidence direction.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art.

Descriptions of well-known functions and constructions may be omitted for increased clarity and conciseness. Also, terms described in below are selected by considering functions in the embodiment and meanings may vary depending on, for example, a user or operator's intentions or customs. Therefore, definitions of the terms should be made on the basis of the overall context. The terminology used in the detailed description is provided only to describe embodiments of the present disclosure and not for purposes of limitation. Unless the context clearly indicates otherwise, the singular forms include the plural forms. It should be understood that the terms "comprises" or "includes" specify some features, numbers, steps, operations, elements, and/or combinations thereof when used herein, but do not preclude the presence or possibility of one or more other features, numbers, steps, operations, elements, and/or combinations thereof in addition to the description.

In the present disclosure, an "intended transmission direction" refers to a direction in which guided waves should propagate within an object in order to inspect the object, and an "intended reception direction" refers to a direction (i.e., an opposite direction of the intended transmission direction) in which echoes of the guided waves which have propagated in the guided transmission direction returns within the object to be tested.

In addition, a "forward guided wave" refers to a guided wave propagating in an intended transmission direction, and a "backward guided wave" refers to a guided wave propagating in an opposite direction to the intended transmission direction.

Moreover, a "forward direction echo" refers to an echo propagating in an intended reception direction, and a "backward direction echo" refers to an echo propagating in an opposite direction to the intended reception direction.

Figure 1:
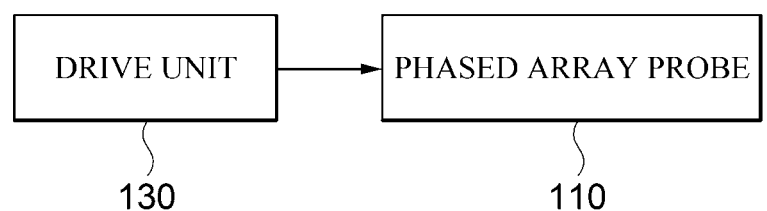
FIG. 1 is a diagram illustrating a configuration of an apparatus for improving transmission directivity according to one embodiment of the present invention.

FIG. 1 is a diagram illustrating a configuration of an apparatus for improving transmission directivity according to one embodiment of the present invention.

Referring to FIG. 1, the apparatus for improving transmission directivity according to one embodiment of the present invention includes a phased array probe 110 and a drive unit 130.

The phased array probe 110 includes the same transducers of two channels that are acoustically coupled to a surface of an object to be tested and are operated in a pulse-echo manner, and each transducer of each channel generate a guided wave by transmitting an ultrasonic wave into an object to be tested according to an electric pulse applied by the drive unit 130.

Meanwhile, the drive unit 130 generates the electric pulses and applies the electric pulses to each of the transducers of the phased array probe 110.

Figure 2:
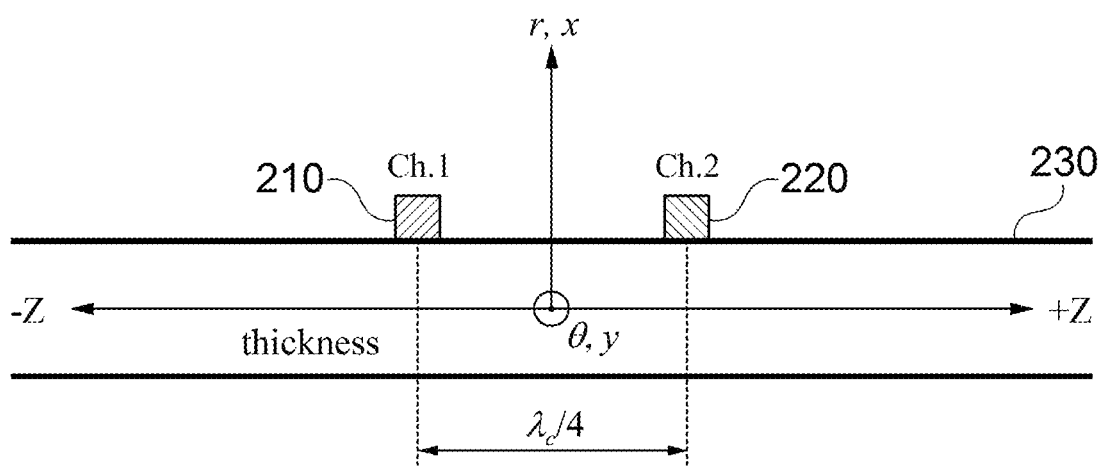
FIG. 2 is a diagram illustrating an example in which a transducer of each channel of the phased array probe is disposed on an object to be tested.
Figure 3:
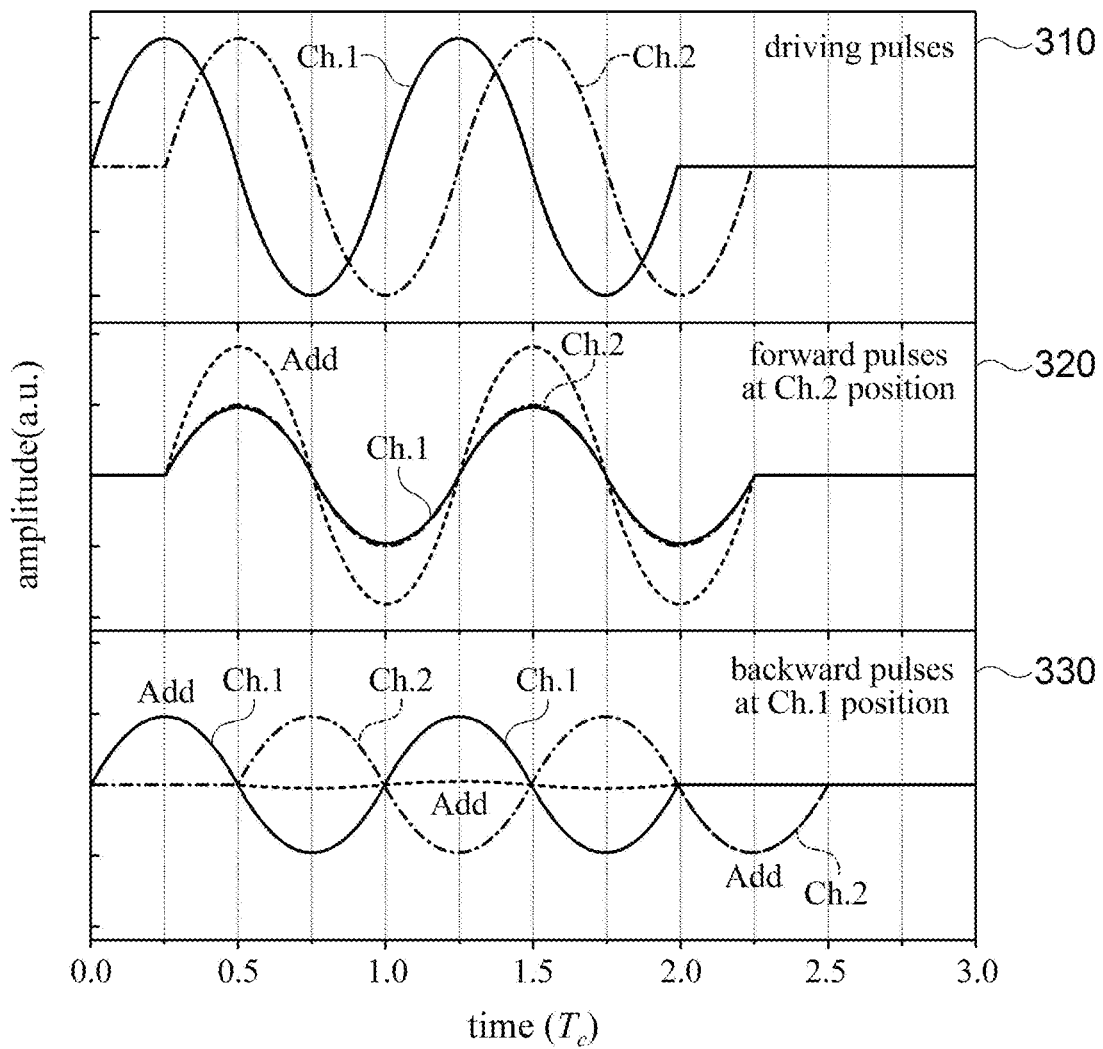
FIG. 3 is a graph showing an example of an electrical pulses applied to a transducer of each channel of a phased array probe according to the prior art and examples of guided wave propagating in an intended transmission direction and in an opposite direction within the object.
Figure 4:
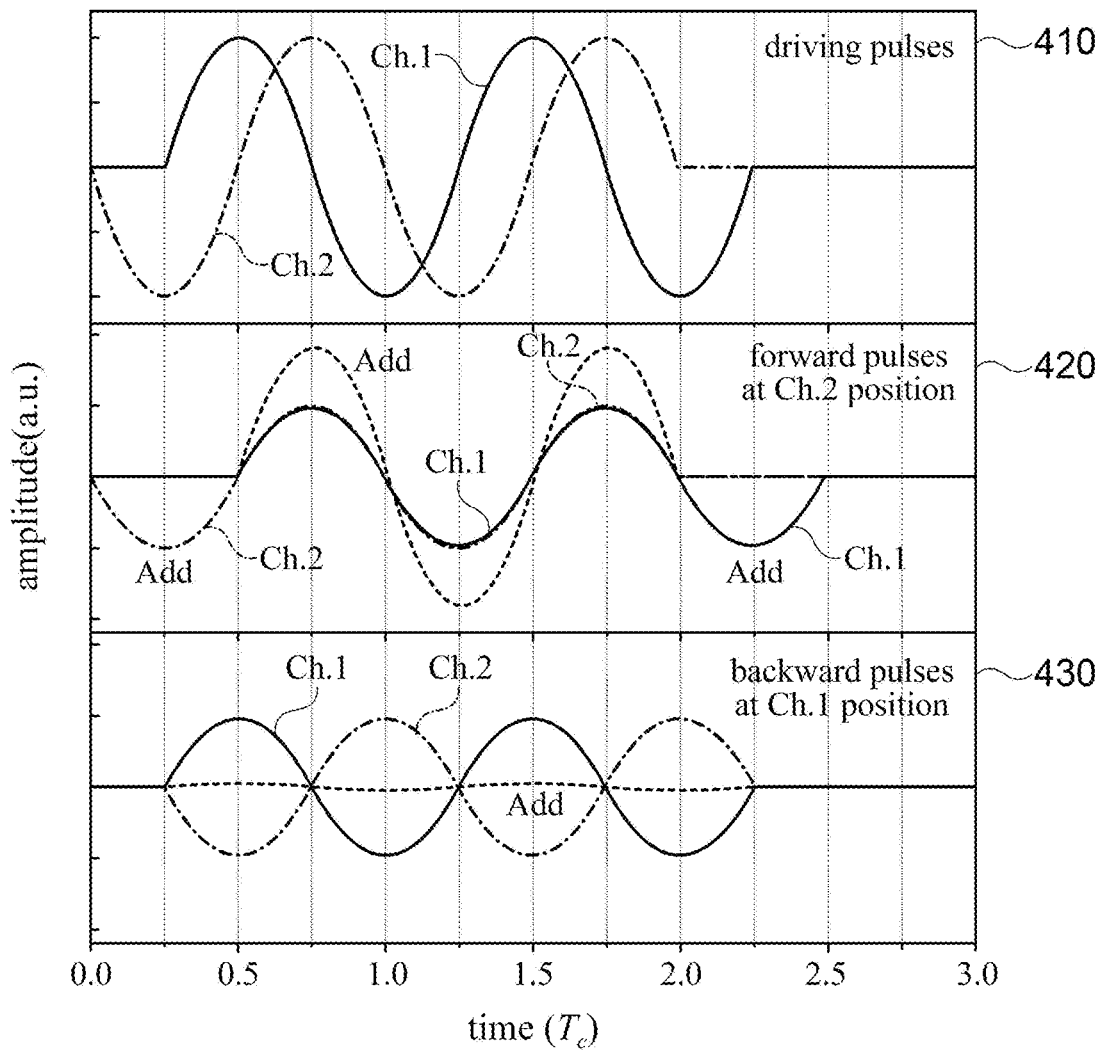
FIG. 4 is a graph showing an example of electric pulses applied to a transducer of each channel of the phased array probe according to one embodiment of the present invention and examples of guided wave propagating in an intended transmission direction and the opposite direction within the object.

Specifically, FIG. 2 is a diagram illustrating an example in which each transducer of each channel of the phased array probe is disposed on the object to be tested, FIG. 3 is a graph showing an example of an electrical pulses applied to the transducer of each channel of a phased array probe according to the prior art and examples of guided wave pulses propagating in an intended transmission direction and in an opposite direction within the object, and FIG. 4 is a graph showing an example of electric pulses applied to the transducer of each channel of the phased array probe according to one embodiment of the present invention and examples of guided wave pulses propagating in an intended transmission direction and the opposite direction within the object.

Referring to FIG. 2, the transducer 210 and 220 of each channel of the phased array probe 110 is disposed on the object 230 at an interval corresponding to a quarter wavelength ($\lambda_c/4$) at a center frequency of an electric wave applied by the drive unit 130 and generates a guided wave into the object 230 according to the electric wave applied by the drive unit 130.

Meanwhile, in the example shown in FIG. 2, the guided waves generated by the phased array probe 110 and echoes for the guided waves may propagate in both directions (+z direction and −z direction) of a z axis parallel to the length direction of the object 230. In this case, the origin of the z axis is the center of positions of the two channel transducers 210 and 220. An axis in the thickness direction of the object 230 may be an r-axis when the object 230 to be tested is a structure shaped as a cylinder, and an x-axis when the object 230 to be tested is a flat plate structure. The other axis perpendicular to the ground becomes either a θ axis or a y-axis.

In the illustrated example, when the right-hand side portion from the position of the phased array probe 110 with respect to the length direction of the object 230 is tested, the intended transmission and reception directions are +z direction and −z direction, respectively.

Meanwhile, for generation of single-mode guided wave pulses having uniform particle displacement along the θ axis (or y-axis), each channel of the phased array probe 110 may be composed of the same transducers connected in series or parallel, and the transducers of the same channel are simultaneously driven by the same electric pulse.

According to the prior art, an electric pulse having the same phase is applied to each of the channel transducers 210 and 220 at time intervals corresponding to a quarter period ($T_c/4$) of the center frequency $f_c$ of the electric pulse.

More specifically, referring to FIGS. 2 and 3, when the example shown in FIG. 2 assumes that an intended transmission direction of a guided wave is the +z direction, in the prior art, an electric pulse (solid line) is first applied to a channel 1 (Ch. 1) transducer 210 disposed forward with respect to the +z direction and the same electric pulse as that applied to the channel 1 transducer 210 is applied to a channel 2 (Ch. 2) transducer disposed rearward with respect to the +z direction at the time when a period of time corresponding to $T_c/4$ elapses from the time of applying the electric pulse to the channel 1 transducer 210, as shown in a graph 310 illustrated at the top of FIG. 3.

Meanwhile, a graph 320 illustrated in the middle of FIG. 3 represents a forward guided wave that propagates in the +z direction at a position of the channel 2 transducer 220. As shown in the example, according to the prior art, a forward guided wave pulse (solid line) generated from the electric pulse by the channel 1 transducer 210 has the same phase as that of a forward guided wave (dashed-dotted line) generated by the channel 2 transducer 220. Therefore, it can be seen that a forward guided wave (Add) pulse (dotted line), which results from interference between the two forward guided waves, has a length of 2 $T_c$ and the amplitude that corresponds to almost twice the amplitude of a guided wave pulse for each channel.

Meanwhile, a graph 330 illustrated at the bottom of FIG. 3 represents a backward guided wave pulse that propagates in the −z direction at a position of the channel 1 transducer 210. As shown in the example, according to the prior art, a backward guided wave pulse (solid line) generated by the channel 1 transducer 210 and a backward guided wave pulse (dashed-dotted line) generated by the channel 2 transducer 220 exist in time intervals having a difference of 0.5 $T_c$, and particularly have a phase difference of 180 degrees in a time interval from 0.5 $T_c$ to 2.0 $T_c$. Therefore, it can be seen that a backward guided wave (Add) pulse (dotted line), which results from interference between the two backward guided waves, has negligible amplitude in the aforementioned time interval, but has the same amplitude as that of the backward guided wave pulse of each channel in the time intervals from 0 to 0.5 $T_c$ and from 2.0 $T_c$ to 2.5 $T_c$.

Meanwhile, according to one embodiment of the present invention, the drive unit 130 applies an electric pulse of opposite phase to each of the transducers 210 and 220 of the respective channels at a time interval corresponding to a quarter period ($T_c/4$) of the center frequency $f_c$ of the electric pulse, so that the transducers 210 and 220 of the respective channels can generate guided wave pulses of opposite phases at a time interval corresponding to $T_c/4$.

Specifically, referring to FIGS. 2 and 4, when the example shown in FIG. 2 assumes that an intended transmission direction of a guided wave pulse is the +z direction, the drive unit 130 may first apply an electric pulse (dashed-dotted line) to a channel 2 transducer 220 disposed rearward with respect to the +z direction and then apply an electric pulse (solid line) having a phase opposite to that of the electric pulse applied to the channel 2 transducer 220 to a channel 1 transducer 210 disposed forward with respect to the +z direction at the time when a period of time corresponding to $T_c/4$ elapses from the time of applying the electric pulse to the channel 2 transducer 220.

Meanwhile, a graph 420 illustrated in the middle of FIG. 4 represents a forward guided wave pulse that propagates in the +z direction at a position of the channel 2 transducer 220. As shown in the example, it can be seen that a forward guided wave pulse (solid line) generated by the channel 1 transducer 210 and a forward guided wave pulse (dashed-dotted line) generated by the channel 2 transducer 220 exist in time regions having a difference of 0.5 $T_c$, and particularly have the same phase in the time regions from 0.5 $T_c$ to 2.0 $T_c$. Thus, it can be seen that a forward guided wave (Add) pulse (dotted line), which results from interference between the two forward guided wave pulses, is lengthened by 0.5 Tc, but has the amplitude almost twice the amplitude of the guided wave of each channel in the aforementioned time regions.

In addition, a graph 430 illustrated at the bottom of FIG. 4 represents a backward guided wave pulse that propagates in the −z direction at a position of the channel 1 transducer 210. As shown in the example, it can be seen that a backward guided wave pulse (solid line) generated by the channel 1 transducer 210 and a backward guided wave pulse (dashed-dotted line) generated by the channel 2 transducer 220 exist in the same time region and have a phase difference of 180 degrees. Thus, a backward guided wave (Add) pulse (dotted line), which results from interference between the two backward guided wave pulses, has negligible amplitude.

As a result, according to the embodiment of the present invention, it is possible to enhance a forward guided wave pulse and simultaneously suppress a backward guided wave pulse effectively, thereby improving the transmission directivity in the long-range ultrasonic testing.

Figure 5:
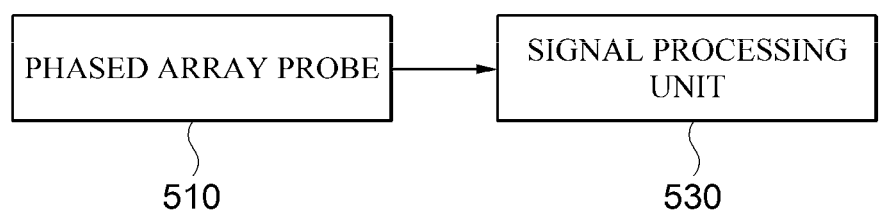
FIG. 5 is a diagram illustrating a configuration of an apparatus for improving reception directivity according to one embodiment of the present invention.

FIG. 5 is a diagram illustrating a configuration of an apparatus for improving reception directivity according to one embodiment of the present invention.

Referring to FIG. 5, the apparatus 500 for improving reception directivity includes a phased array probe 510 and a signal processing unit 530.

In the example shown in FIG. 5, the phased array probe 510 has the same configuration as that illustrated in FIG. 1, and thus a detailed description thereof will be omitted.

The signal processing unit 530 may delay one of phases of signals of two channels detected by two channel transducers of the phased array probe 510, adjust amplitudes of the phase-delayed signal and the other signal using a phase difference between the two signals, and then add the two amplitude-adjusted signals.

For example, when the intended reception direction is the −z direction in FIG. 2, the signal processing unit 530 may delay a phase of a signal detected by the channel 2 transducer 220. On the other hand, when the intended reception direction is the +z direction, the signal processing unit 510 may delay a phase of a signal detected by the channel 1 transducer 210.

Specifically, since spacing between the channel 1 transducer 210 and the channel 2 transducer 220 corresponds to $\lambda_c/4$, forward echoes detected by the respective transducers have a time difference of $T_c/4$. Hence, when it is assumed that the intended reception direction is the −z direction in FIG. 2, forward echoes received in the −z direction are first detected by the channel 2 transducer 220 and then detected by the channel 1 transducer 210 after an elapse of $T_c/4$.

Therefore, a phase of a forward echo signal detected by the channel 2 transducer 220 precedes a phase of a forward echo signal detected by the channel 1 transducer 210 by 90 degrees at the center frequency $f_c$. Accordingly, when the signal detected by the channel 2 transducer 220 is delayed by 90 degrees as in the prior art, the phase-delayed signal and the non-phase delayed signal have the same phase at the center frequency $f_c$.

On the contrary, in the case of backward echoes, a phase of a backward echo signal detected by the channel 2 transducer 220 lags a phase of a backward echo signal detected by the channel 1 transducer 210 by 90 degrees at the center frequency $f_c$, and thus when the phase of the signal detected by the channel 2 transducer 220 is delayed by 90 degrees as in the prior art, the phase-delayed signal and the non-phase delayed signal have a phase difference of 180 degrees at the center frequency $f_c$.

However, since a phase difference due to the above-described fixed spacing (i.e., $\lambda_c/4$) between the channel 1 transducer 210 and the channel 2 transducer 220 varies according to a wave frequency of a guided wave, a phase delay value of a signal detected by the channel 2 transducer 220 also needs to be adjusted according to the wave frequency.

Therefore, according to one embodiment of the present invention, the signal processing unit 530 may delay differently a phase of a signal detected by one transducer of the two channel transducers 210 and 220, which is disposed forward with respect to the intended reception direction, according to the wave frequency.

As a specific example, the signal processing unit 530 may delay a phase of a signal detected by the transducer disposed forward with respect to the intended reception direction by using a phase delay function as shown in Equation 1 below.

$$\phi = \frac{90° \cdot f_c}{f} \qquad \text{[Equation 1]}$$

Here, $f_c$ denotes a center frequency and $f$ denotes a wave frequency of a detected signal.

In Equation 1, the phase delay function gives the same phase delay value (i.e., 90 degrees) as the prior art at the center frequency $f_c$. The use of phase delay through the phase delay function of Equation 1 may cause a phase difference between two backward echo signals to deviate from 180 degrees as the wave frequency moves away from the center frequency. This means that it is difficult to suppress the backward echo signals by simply adding two pieces of signal data as in the prior art.

Therefore, according to one embodiment of the present invention, the signal processing unit 530 may adjust the amplitude of the phase-delayed signal and the amplitude of the other signal using a phase difference between the phase-delayed signal and the other signal, and then add the two amplitude-adjusted signals.

As a specific example, the above amplitude adjustment may be performed by multiplying the phase-delayed signal and the other signal by an amplitude adjustment function dependent on said phase difference. In this case, when a phase difference is 0 as in ideal forward echo signals, the amplitudes may not be changed, and when a phase difference is 180 degrees as in ideal backward echo signals, the amplitudes of the signals need to be decreased to zero. Thus, the amplitude adjustment function may need to provide values between 0 and 1.

In addition, since the phase difference between the backward echo signals to be suppressed is close to 180 degrees, the change in the value of the amplitude adjustment function may need to be relatively small in a phase difference region around 180 degrees compared to a phase difference region around 0 degrees.

Thus, as an example that satisfies the aforementioned requirements, the signal processing unit 530 may use the amplitude adjustment function as shown in Equation 2 below.

$$g_\theta = (1 - |\sin(\Delta\theta/2)|)^m \qquad \text{[Equation 2]}$$

Here, $\Delta\theta$ denotes a phase difference between a phase-delayed signal and the other signal and m denotes an integer greater than or equal to 0.

The use of amplitude adjustment function given by Equation 2 may allow for efficient suppressing of backward echo signals. In addition, the application of the function will provide similar effects for both ends of a signal given by adding the two signals having a time difference.

Figure 6:
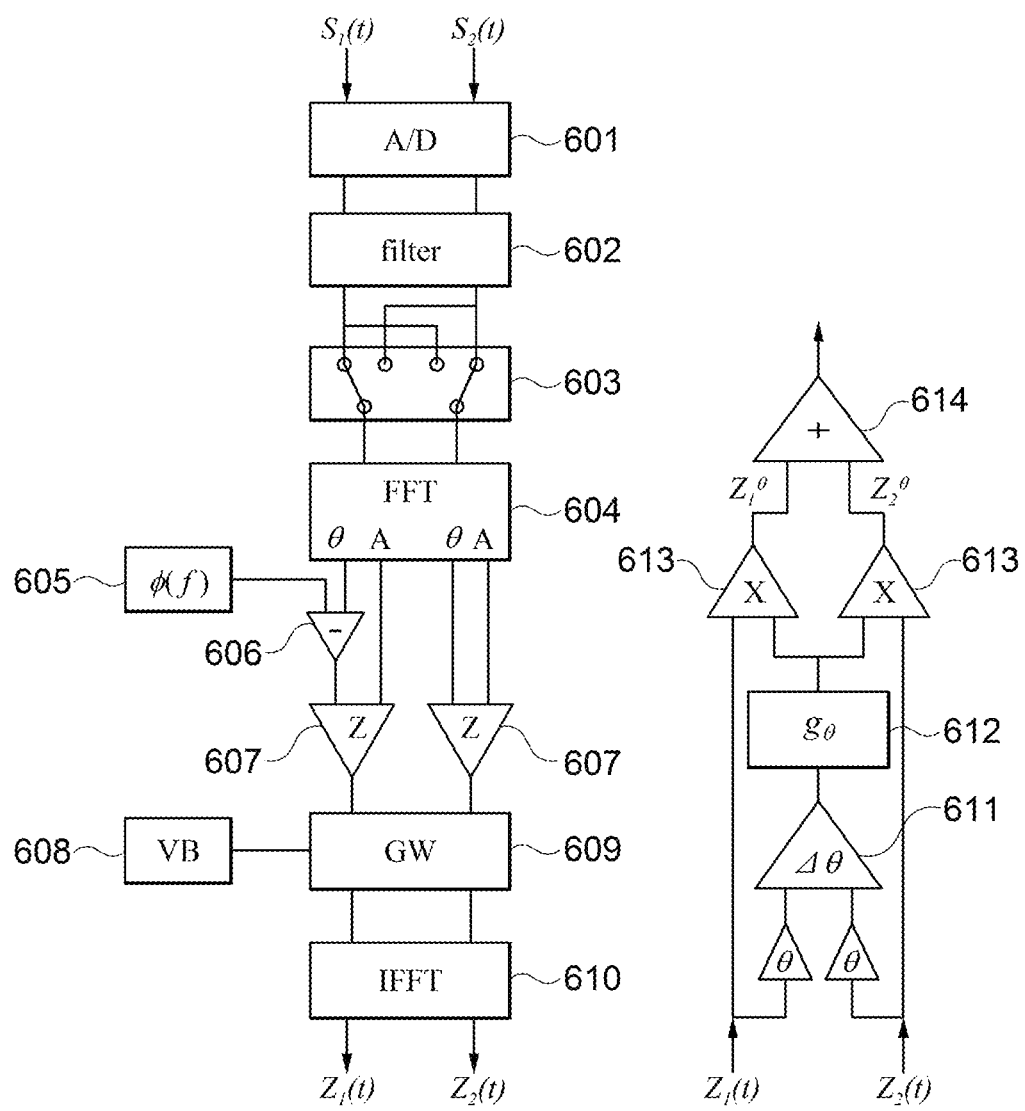
FIG. 6 is a diagram illustrating a signal processing process performed by a signal processing unit according to one embodiment of the present invention.

FIG. 6 is a diagram illustrating a signal processing process performed by the signal processing unit 530 according to one embodiment of the present invention.

Referring to FIG. 6, the signal processing unit 530 may convert analog signals $S_1(t)$ and $S_2(t)$ detected by the two channel transducers 210 and 220 of the phased array probe 510 into digital signals (601), and perform filtering on the converted digital signals using a filter having a fixed pass-bandwidth (602).

Thereafter, the signal processing unit 530 may select a signal for phase delay from the converted digital signals (603). In this case, the signal for phase delay may be selected by an intended reception direction. Specifically, the signal processing unit 530 may select a signal detected by one channel transducer of the two channel transducers 210 and 220, which first detects a forward echo (i.e., a channel transducer disposed forward with respect to the intended reception direction), as the signal for phase delay.

Then, the signal processing unit 530 may perform fast Fourier transform (FFT) on each of the digital signals to obtain an amplitude spectrum and a phase spectrum of each of the digital signals (604).

Then, the signal processing unit 530 may delay a phase of a spectrum for the selected digital signal for phase delay using a frequency-dependent phase adjustment function (605 and 606). For example, the signal processing unit 530 may calculate a phase delay value according to a frequency by using the phase adjustment function according to the above-described Equation 1 and delay the phase of a spectrum for the selected digital signal for phase delay using the calculated phase delay value.

Then, the signal processing unit 530 may convert the amplitude spectrum and the phase spectrum of each of the phase-delayed digital signal and the non-phase delayed digital signal into a complex spectrum (607).

Then, the signal processing unit 530 may adjust the converted complex spectra using Gaussian window (GW) having a variable bandwidth (VB) (608 and 609).

Then, the signal processing unit 530 may convert the complex spectra into time-domain complex signals $Z_1(t)$ and $Z_2(t)$ by performing inverse fast Fourier transform (IFFT) on the complex spectra (610).

Then, the signal processing unit 530 may measure a phase difference $\Delta\theta$ between the complex signals $Z_1(t)$ and $Z_2(t)$ and calculate an amplitude adjustment value for the complex signals $Z_1(t)$ and $Z_2(t)$ using the measured phase difference and a phase-difference-dependent amplitude adjustment function (612).

For example, the signal processing unit 530 may calculate the amplitude adjustment value for the complex signals $Z_1(t)$ and $Z_2(t)$ by applying the phase difference $\Delta\theta$ between the complex signals $Z_1(t)$ and $Z_2(t)$ to the amplitude adjustment function according to the above-described Equation 2.

Then, the signal processing unit 530 may adjust amplitudes of the complex signals $Z_1(t)$ and $Z_2(t)$ by multiplying each of the complex signals $Z_1(t)$ and $Z_2(t)$ by the calculated amplitude adjustment value and then output the sum of amplitude-adjusted complex signals $Z_1^\theta$ and $Z_2^\theta$ (614).

Figure 7:
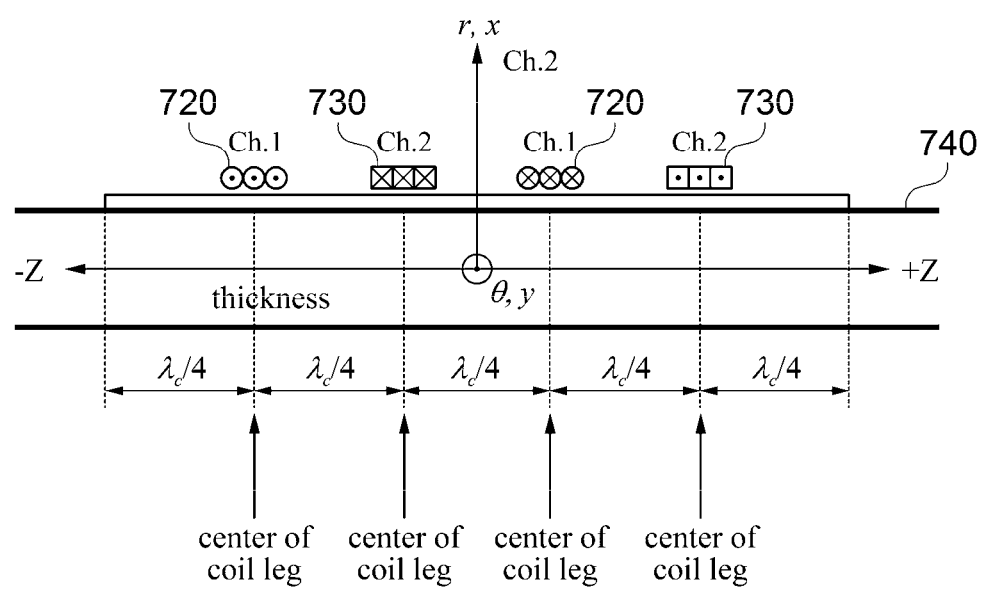
FIG. 7 is a diagram illustrating an example in which a phased array magnetostrictive probe according to one embodiment of the present invention is disposed on an object to be tested.

Meanwhile, according to one embodiment of the present invention, the phased array probe 110 of the apparatus 100 of FIG. 1 for improving transmission directivity and the phased array probe 510 of the apparatus 500 of FIG. 5 for improving reception directivity may be configured as a phased array magnetostrictive probe shown in FIG. 7.

Specifically, FIG. 7 is a diagram illustrating an example in which a phased array magnetostrictive probe according to one embodiment of the present invention is disposed on an object to be tested.

Referring to FIG. 7, the phased array magnetostrictive probe includes a magnetostrictive band 710, a channel 1 radiofrequency (RF) coil 720, and a channel 2 RF coil 730.

The magnetostrictive band 710 may be acoustically coupled to a surface of the object 740 to be tested and the channel 1 RF coil 720 and the channel 2 RF coil may each be formed of a spiral coil having a distance of $\lambda_c/2$ between centers of coil legs. In the present specification, the magnetostrictive band 710 is used to collectively refer to a magnetostrictive strip, a magnetostrictive patch, and a magnetostrictive band.

Meanwhile, the channel 1 RF coil 720 and the channel 2 RF coil 730 are arranged on the magnetostrictive band 710 at an interval corresponding to the distance of $\lambda_c/4$ between the centers of adjacent coil legs.

The magnetostrictive band 710 may have a width corresponding to a distance of $\lambda_c/4$ between each end of the magnetostrictive band 710 in a width direction (i.e., a z-axis direction) and the center of coil legs adjacent to each end.

Specifically, in the illustrated example, the right end of the magnetostrictive band 710 is adjacent to the right leg of the channel 2 RF coil 730 and a distance between the center of the leg of the channel 2 RF coil 730 and the right end of the magnetostrictive band 710 corresponds to $\lambda_c/4$. Likewise, the left end of the magnetostrictive band 710 is adjacent to the left leg of the channel 1 RF coil 720 and a distance between the center of the leg of the channel 1 RF coil 720 and the left end of the magnetostrictive band 710 corresponds to $\lambda_c/4$.

Thus, in the illustrated example, the width of the magnetostrictive band 710 corresponds to $5\lambda_c/4$. When solenoid-type RF coils having one leg are used instead of the spiral coil, a required width of the magnetostrictive band 710 may correspond to $3\lambda_c/4$. That is, in general, when RF coils having k legs are used, the required width of the magnetostrictive band 710 may correspond to $(2k+1)\lambda_c/4$. A frequency spectrum of the guided wave pulse generated by the probe including the magnetostrictive band 710 having the above-described width resembles a spectrum of a driving electric pulse. This is because the center frequency of the driving electric pulse is close to anti-resonance frequency for widthwise vibration of the magnetostrictive band.

Meanwhile, the drive unit 130 may apply an electric pulse of opposite phase to each of the RF coils 720 and 730 at a time interval $T_c/4$ corresponding to a quarter period at the electric pulse center frequency $f_c$, thereby allowing guided wave pulses of opposite phases to be generated at a time interval corresponding to $T_c/4$.

Specifically, when the example shown in FIG. 7 assumes that the intended transmission direction of the guided wave pulse is the +z direction, the drive unit 130 may first apply an electric pulse to the channel 2 RF coil 730 and then apply an electric pulse of a phase opposite to that of the electric pulse applied to the channel 2 RF coil 730 to the channel 1 RF coil 720 after an elapse of a time corresponding to $T_c/4$. Accordingly, as described with reference to FIG. 3, a forward guided wave in the object 740 to be tested is enhanced by constructive interference and a backward guided wave is effectively suppressed by destructive interference.

Meanwhile, a distance (i.e., $\lambda_c/4$) between each end in the width direction of the magnetostrictive band 710 and the center of coil leg adjacent to each end may induce coherency between an enhanced forward guided wave pulse and a pulse reflected and returned from one end of the magnetostrictive band 710 due to a thickness difference. This is because the phase shift of the pulse due to the reciprocating propagation distance of the guided wave in the object 740 to be tested and due to the internal reflection at the end of the magnetostrictive band 710 is 180 degrees, respectively. Such the coherency at the center frequency $f_c$ may minimize the distortion of frequency characteristics of the phased array magnetostrictive probe due to the internal reflection from one end of the magnetostrictive band 710.

In the process of receiving echoes, the diffraction phenomenon of the guided wave occurs at the end of the magnetostrictive band 710. At a very low wave frequency, this phenomenon may help rapid formation of a guided wave in a region of the magnetostrictive band 710 attached to the object 740 to be tested. However, due to the geometric acoustical properties of incident echoes, the formation of guided wave may be delayed as the wave frequency increases. This implies that the signal amplitude for a channel that first detects the incident echoes will be less than the signal amplitude for the other channel.

In addition, dominant internal reflection of the incident echoes may occur at an end of the magnetostrictive band 710 adjacent to the RF coil leg that detects the echoes latest. That is, when considering the phase shift of 180 degrees caused by the internal reflection, it may be inferred that an echo at the position of the coil leg results from constructive interference between a directly arriving echo and the echo reflected and returned from one end of the magnetostrictive band 710 and hence having a time difference of $T_c/2$.

On the contrary, an echo at the position of coil leg of the other channel adjacent to the above coil leg may result from destructive interference between two echoes having a time difference of $T_c$.

This discussion implies that the signal amplitude for a channel that first detects the incident echoes will be less than the signal amplitude of the other channel. In other words, this implies that a sign of an amplitude difference between two channel signals will be dependent on a direction in which the echoes are received.

Specifically, in FIG. 7, since an echo received in the −z direction is first detected by the channel 2 RF coil 730, the amplitude of the signal detected by the channel 2 RF coil 730 is less than the amplitude of the signal detected by the channel 1 RF coil 720.

On the contrary, since an echo received in the +z direction is first detected by the channel 1 RF coil 720, the amplitude of the signal detected by the channel 1 RF coil 720 is less than the amplitude of the signal detected by the channel 2 RF coil 730.

Therefore, according to one embodiment of the present invention, the signal processing unit 530 may adjust the amplitude of the phase-delayed signal and the amplitude of the other signal using a phase difference between the two signals, as described above, and then further adjust the amplitudes of the two amplitude-adjusted signals on the basis of the amplitude difference of the two adjusted signals and the intended reception direction.

As a specific example, the signal processing unit 530 may calculate an amplitude adjustment value using the amplitude adjustment function as shown in Equation 3 below, then multiply the two signal amplitudes which were adjusted on the basis of phase difference by the amplitude adjustment value and sum up the resulting values.

$$g_A = \begin{cases} 1, \text{ for } A_F < A_L \\ \left(\frac{A_L}{A_F}\right)^n, \text{ for } A_F \geq A_L \end{cases} \quad \text{[Equation 3]}$$

In Equation 3, $A_F$ denotes the amplitude of the amplitude-adjusted signal of a channel that first detects an echo propagating in the intended reception direction, $A_L$ denotes the amplitude of the amplitude-adjusted signal of the other channel, and n denotes an integer greater than or equal to 0.

In the case of a forward echo received in the intended reception direction, $A_F$ becomes less than $A_L$, and in this case, the amplitude adjustment value obtained by Equation 3 becomes 1.

On the contrary, in the case of a backward echo received in the opposite direction to the intended reception direction, $A_F$ becomes greater than $A_L$, and in this case, the amplitude adjustment value obtained by Equation 3 becomes less than or equal to 1 according to a value of n. In this case, the amplitude adjustment value becomes smaller as the value of n increases. Thus, consequently, it is possible to effectively reduce the amplitude of the backward echo signal.

Figure 8:
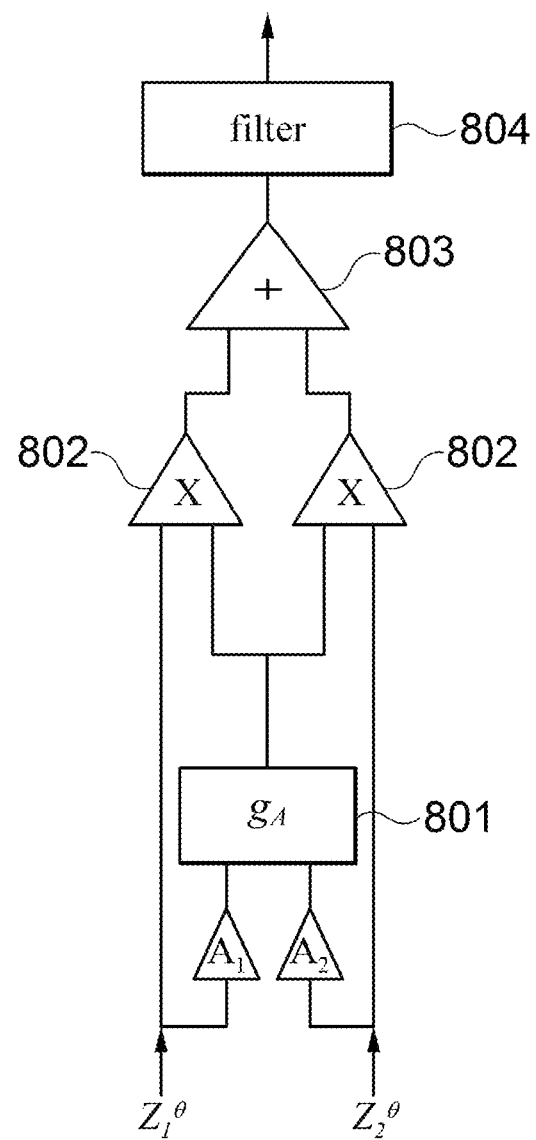
FIG. 8 is a diagram illustrating a further amplitude adjustment process performed by the signal processing unit according to one embodiment of the present invention.

FIG. 8 is a diagram illustrating a further amplitude adjustment process performed by the signal processing unit 530 according to one embodiment of the present invention.

Referring to FIG. 8, the signal processing unit 530 calculates an amplitude adjustment value based on a difference between amplitudes $A_1$ and $A_2$ of amplitude-adjusted complex signals $Z_1^\theta$ and $Z_2^\theta$ generated through the process illustrated in FIG. 6 and the intended reception direction (801). In this case, the amplitude adjustment function of Equation 3 described above may be used to calculate the amplitude adjustment value. When the intended reception direction is the −z direction, the amplitude $A_2$ of the channel 2 becomes $A_F$, and when the intended reception direction is the +z direction, the amplitude $A_1$ of the channel 1 becomes $A_F$.

Then, the signal processing unit 530 may adjust the amplitude by multiplying each of the complex signals $Z_1^\theta$ and $Z_2^\theta$ by the calculated amplitude adjustment value (802), and sum up the amplitude-adjusted complex signals (803).

Then, the signal processing unit 530 may perform fixed bandwidth pass filtering on the summed complex signals in order to remove noise which may occur during the amplitude adjustment process (804).

Hereinafter, for the verification of the present invention, a test of a straight pipe (carbon steel, 3 m in length, 166 mm in external diameter, and 8 mm in thickness) using a phased array probe including a magnetostrictive band (115 mm in width and about 1 mm in thickness) and two spiral RF coils (23 mm of channel spacing) as illustrated in FIG. 7 will be described. The pipe used in the test has no particular discontinuity expect at both ends.

Meanwhile, the phased array probe is disposed at 0.7 m from the left end of the pipe and is operated to test the right side of the pipe using a guided wave of T(0,1) mode. From the propagation velocity (about 3240 m/s) of the guided wave and the spacing between the spiral RF coils of two channels, the center frequency $f_c$ of electric pulses is determined by Equation 4 shown below.

$$f_c = 3240/(4 \times 23) \approx 35 \text{ (kHz)} \quad \text{[Equation 4]}$$

The above test is performed using three transmission/reception technologies. One is the existing transmission/reception technology, another is a combination of the transmission technology according to the embodiment of the present invention and the existing reception technology, and the other is the transmission/reception technology according to the embodiment of the present invention. Regardless of the technologies in use, the number of cycles of the electric pulse is fixed at 3.

Meanwhile, operating parameters selected for application of the reception technology according to the embodiment of the present invention are as follow: m=1 and n=0. In addition, a frequency bandwidth of Gaussian window is 75% of the center frequency $f_c$.

Figure 9:
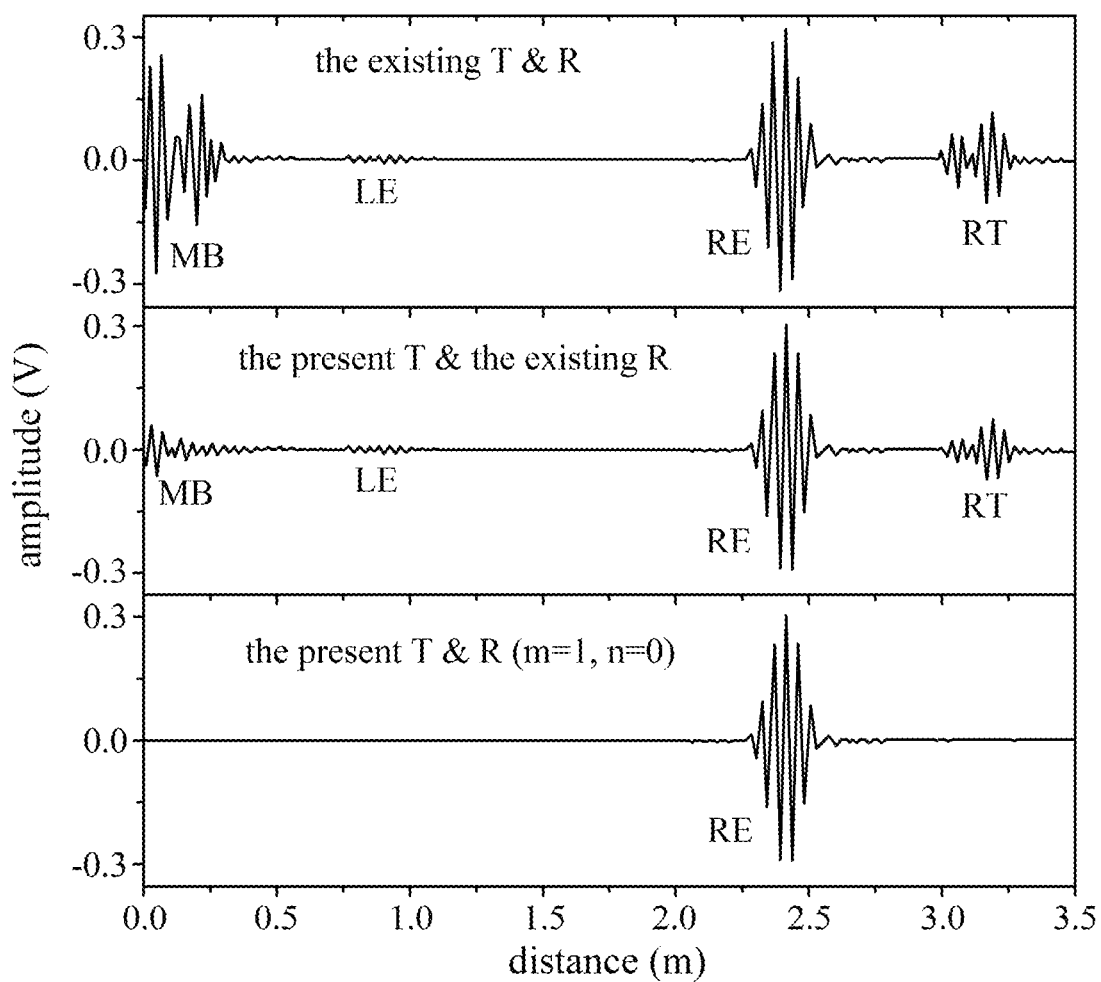
FIGS. 9 and 10 are graphs showing test results obtained by using the embodiment of the present invention and the prior art.

RF signal data for test results according to the transmission/reception technologies is shown in FIG. 9. In the example shown in FIG. 9, a graph illustrated at the top shows a test result obtained by using the existing transmission/reception technology, a graph illustrated in the middle shows a test result obtained by using the combination of the transmission technology according to the embodiment of the present invention and the existing reception technology, a graph illustrated at the bottom shows a test result obtained by using the transmission/reception technology according to the embodiment of the present invention.

Meanwhile, in the example shown in FIG. 9, MB (mainbang) denotes an echo caused by electric pulses entering a reception circuit connected in parallel to the phased array probe, LE (left end) and RF (right end) denote echoes caused by reflections from the left side and the right side of the pipe, respectively, and it can be seen that RE signals are much greater than LE signals. In addition, RT (round trip) denotes echoes that are reciprocated once in the length direction of the pipe. That is, RT signals result from superimposition of a backward echo signal caused by a forward guided wave and a forward echo signal caused by a backward guided wave. As described above, since the forward guided wave is enhanced due to the transmission directivity and the backward guided wave is suppressed, a backward RT echo may be far superior to a forward RT echo.

In the shown test results, it can be seen that the RE signals for the three transmission/reception technologies have almost the same amplitude while the amplitudes of the other signals are significantly different. Particularly, in the case of the transmission/reception technology according to the embodiment of the present invention, it can be seen that the signals other than the RE signal are weak enough to be invisible. This indicates that the transmission/reception directivity of the transmission/reception technology according to the embodiment of the present invention is significantly superior to the transmission/reception directivity of the existing technology. Such excellence relies heavily on reception directivity.

It can be seen from comparison of two LE signals in the graphs shown at the top and middle that the transmission technology according to the embodiment of the present invention provides twice as much enhanced transmission directivity as compared to the prior art.

In addition, the fact that the RT signal does not appear in the graph shown at the bottom implies that the phase difference between the two channel signals of the phased array probe is close to 180 degrees. This indicates that a backward echo is significantly superior to a forward echo in constructing the RT signal.

Figure 10:
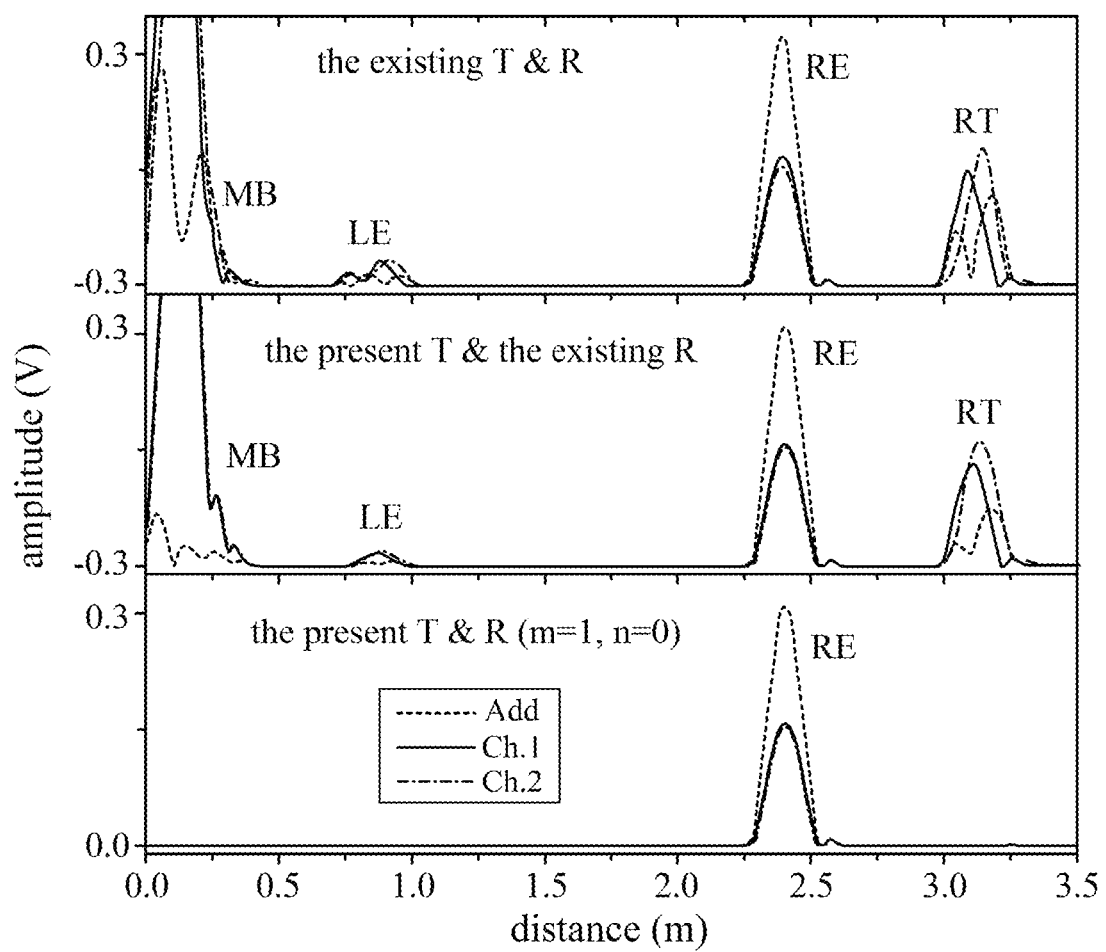

FIG. 10 shows video signal data corresponding to the RF signal data shown in FIG. 9 and two components thereof (i.e., video signals of two channels). Specifically, in the example shown in FIG. 10, a graph illustrated at the top shows video signal data corresponding to the RF signal data shown at the top of FIG. 9, a graph illustrated in the middle shows video signal data corresponding to the RF signal data shown in the middle of FIG. 9, and a graph illustrated at the bottom shows video signal data corresponding to the RF signal data shown at the bottom of FIG. 9.

Referring to FIG. 10, it can be seen that the RF signals caused by forward echoes received in the intended reception direction have a small time difference between two channel signals and signals of a channel 2 transducer that detects first the forward echoes are slightly smaller than signals of a channel 1 transducer.

On the other hand, it can be seen that the LE or RT signals mainly caused by backward echoes propagating in the +z-axis direction have a significant time difference between two channel signals and signals of the channel 1 transducer in the middle region are considerably larger than channel 2 signals. It can also be seen that such a time difference for the transmission technology according to the embodiment of the present invention is considerably smaller and in an initial region due to the time difference, the amplitude of a channel 1 signal is greater than the amplitude of a channel 2 signal. In any event, the backward signals appear to be very efficiently suppressed by using the amplitude adjustment function dependent on a phase difference. However, closer observation reveals that tail portions of the RT signals are not sufficiently suppressed so that fractions remain near 3.25 m. Although not explicitly shown in the drawing, it is possible to suppress signals, such as tail portions, more efficiently by using the amplitude adjustment function that depends on the amplitude difference.

The methods and/or operations described above may be recorded, stored, or fixed in one or more computer-readable storage media that includes program instructions to be implemented by a computer to cause a processor to execute or perform the program instructions. The media may also include, alone or in combination with the program instructions, data files, data structures, and the like. Examples of computer-readable media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

The invention claimed is:

1. An apparatus, comprising:
a phased array probe comprising two channel transducers arranged on a subject to be tested at an interval corresponding to a quarter wavelength at a center frequency of a guided wave pulse for long-range ultrasonic testing; and
a drive unit configured to drive one transducer of the two channel transducers, which is disposed rearward with respect to an intended direction of the guided wave pulse, to transmit a forward guided wave pulse and a backward guided wave pulse into the object to be tested by supplying a first electric pulse to the channel transducer disposed rearward and then to drive the other transducer of the two channel transducers, which is disposed forward with respect to the intended direction, to transmit a forward guided wave pulse and a backward guided wave pulse into the object to be tested by supplying a second electric pulse of a phase opposite to that of the first electric pulse to the channel transducer disposed forward after an elapse of a time interval corresponding to a quarter wavelength at the center frequency from a time of supplying the first electric pulse, thereby causing the two backward guided wave pulses transmitted by the channel transducer disposed forward and the channel transducer disposed rearward to overlap with each other without a time difference and form destructive interference.

2. An apparatus, comprising:
a phased array probe comprising two channel transducers arranged on an object to be tested at an interval corresponding to a quarter wavelength of a center frequency of a guided wave pulse for long-range ultrasonic testing; and
a signal processing unit configured to delay a phase of one of guided wave echo signals detected by each of the two channel transducers, adjust amplitudes of the phase-delayed guided wave echo signal and a non-phase delayed guided wave echo signal among the detected guided wave echo signals by using a phase difference between the phase-delayed guided wave echo signal and the non-phase delayed guided wave echo signal, and then sum up the two amplitude-adjusted guided wave echo signals.

3. The apparatus of claim 2, wherein the signal processing unit generates the phase-delayed signal using a phase delay function of $$\phi = \frac{90° \cdot f_c}{f}$$

where $f_c$ denotes the center frequency and $f$ denotes a wave frequency of a detected guided wave echo signal.

4. The apparatus of claim 2, wherein the signal processing unit adjusts the amplitudes of the phase-delayed guided wave signal and the non-phase delayed guided wave echo signal using an amplitude adjustment function of $g_\theta = (1 - |\sin(\Delta\theta/2)|)^m$ where $\Delta\theta$ denotes the phase difference and m is an integer greater than or equal to 0.

5. The apparatus of claim 2, wherein the phased array probe further comprises a magnetostrictive band having a width corresponding to a $(2k+1)\lambda_c/4$ where k is an integer greater than or equal to 1, and $\lambda_c$ is a wavelength at the center frequency, the two channel transducers are radiofrequency (RF) coils arranged on the magnetostrictive band at an interval corresponding to the quarter wavelength, and a distance between each end of the magnetostrictive band in the width direction and a center of coil leg adjacent to the end is the same as the quarter wavelength.

6. The apparatus of claim 5, wherein the signal processing unit further adjusts the amplitudes of the two amplitude-adjusted guided wave echo signals based on an intended reception direction of a guided wave echo and an amplitude difference between the two amplitude-adjusted guided wave echo signals.

7. The apparatus of claim 6, wherein the signal processing unit further adjusts the amplitudes of the two amplitude-adjusted guided wave echo signals using an amplitude adjustment function of $$g_A = \begin{cases} 1, & \text{for } A_F < A_L \\ \left(\frac{A_L}{A_F}\right)^n, & \text{for } A_F \geq A_L \end{cases}$$

where $A_F$ denotes an amplitude of an amplitude-adjusted guided wave echo signal of a channel that first detects a guided wave echo propagating in the intended reception direction, $A_L$ denotes an amplitude of an amplitude-adjusted guided wave echo signal of the other channel, and n is an integer greater than or equal to 0.

8. A method performed using a phased array probe comprising two channel transducers arranged on an object to be tested at an interval corresponding to a quarter wavelength of a center frequency of a guided wave pulse for long-range ultrasonic testing, the method comprising:
driving one transducer of the two channel transducers, which is disposed rearward with respect to an intended direction of the guided wave pulse, to transmit a forward guided wave pulse and a backward guided wave pulse into the object to be tested by supplying a first electric pulse to the channel transducer disposed rearward; and
driving the other transducer of the two channel transducer, which is disposed forward with respect to the intended direction, to transmit a forward guided wave pulse and a backward guided wave pulse into the object to be tested by supplying a second electric pulse of a phase opposite to that of the first electric pulse to the channel transducer disposed forward after an elapse of a time interval corresponding to a quarter wavelength at the center frequency from a time of supplying the first electric pulse, thereby causing the two backward guided wave pulses transmitted by the channel transducer disposed forward and the channel transducer disposed rearward to overlap with each other without a time difference and form destructive interference.

9. A method performed using a phased array probe comprising two channel transducers arranged on an object to be tested at an interval corresponding to a quarter wavelength of a center frequency of a guided wave pulse for long-range ultrasonic testing, the method comprising:
delaying a phase of one of guided wave echo signals detected by each of the two channel transducers;
adjusting amplitudes of the phase-delayed guided wave echo signal and a non-phase delayed guided wave echo signal among the detected guided wave echo signals by using a phase difference between the phase-delayed guided wave echo signal and the non-phase delayed guided wave echo signal; and
summing the two amplitude-adjusted guided wave echo signals.

10. The method of claim 9, wherein the delaying of the phase comprises delaying the phase using a phase delay function of $$\phi = \frac{90° \cdot f_c}{f}$$

where $f_c$ denotes the center frequency and $f$ denotes a wave frequency of a detected guided wave echo signal.

11. The method of claim 9, wherein the adjusting of the amplitudes comprises adjusting the amplitudes of the phase-delayed guided wave signal and the non-phase delayed guided wave echo signal using an amplitude adjustment function of $g_\theta = (1-|\sin(\Delta\theta/2)|)^m$ where $\Delta\theta$ denotes the phase difference and m is an integer greater than or equal to 0.

12. The method of claim 9, wherein the phased array probe further comprises a magnetostrictive band having a width corresponding to a $(2k+1)\lambda_c/4$ where k is an integer greater than or equal to 1, and $\lambda_c$ is a wavelength at the center frequency, the two channel transducers are radiofrequency (RF) coils arranged on the magnetostrictive band at an interval corresponding to the quarter wavelength, and a distance between each end of the magnetostrictive band in the width direction and a center of coil leg adjacent to the end is the same as the quarter wavelength.

13. The method of claim 12, wherein the summing comprises further adjusting the amplitudes of the two amplitude-adjusted guided wave echo signals based on an intended reception direction of a guided wave echo and an amplitude difference between the two amplitude-adjusted guided wave echo signals and summing the two guided wave echo signals whose amplitudes are further adjusted.

14. The method of claim 13, wherein the further adjusting of the amplitudes comprises further adjusting the amplitudes of the two amplitude-adjusted guided wave echo signals using an amplitude adjustment function of $$g_A = \begin{cases} 1, & \text{for } A_F < A_L \\ \left(\frac{A_L}{A_F}\right)^n, & \text{for } A_F \geq A_L \end{cases}$$

where $A_F$ denotes an amplitude of an amplitude-adjusted guided wave echo signal of a channel that first detects a guided wave echo propagating in the intended reception direction, $A_L$ denotes an amplitude of an amplitude-adjusted guided wave echo signal of the other channel, and n is an integer greater than or equal to 0.

15. A phased array magnetostrictive probe comprising:
a magnetostrictive band having a width corresponding to a $(2k+1)\lambda_c/4$ where k is an integer greater than or equal to 1, and $\lambda_c$ is a wavelength at a center frequency of a guided wave pulse for long-range ultrasonic testing; and
a channel 1 RF coil and a channel 2 RF coil arranged on the magnetostrictive band at an interval corresponding to a quarter wavelength at the center frequency,
wherein a distance between each end of the magnetostrictive band in the width direction and a center of coil leg adjacent to the end corresponds to the quarter wavelength.

* * * * *